(12) United States Patent
Dong et al.

(10) Patent No.: US 11,737,344 B2
(45) Date of Patent: Aug. 22, 2023

(54) DISPLAY PANEL AND MANUFACTURING METHOD THEREOF

(71) Applicant: Wuhan China Star Optoelectronics Semiconductor Display Technology Co., Ltd., Hubei (CN)

(72) Inventors: Wenbo Dong, Hubei (CN); Xiaomeng Hou, Hubei (CN); Quanming Bai, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 401 days.

(21) Appl. No.: 17/054,787

(22) PCT Filed: Sep. 11, 2020

(86) PCT No.: PCT/CN2020/114712
§ 371 (c)(1),
(2) Date: Nov. 12, 2020

(87) PCT Pub. No.: WO2021/243878
PCT Pub. Date: Dec. 9, 2021

(65) Prior Publication Data
US 2022/0190262 A1    Jun. 16, 2022

(30) Foreign Application Priority Data
Jun. 2, 2020 (CN) .......................... 202010490750.7

(51) Int. Cl.
*H10K 77/10* (2023.01)
*B32B 5/18* (2006.01)
(Continued)

(52) U.S. Cl.
CPC .............. *H10K 77/111* (2023.02); *B32B 5/18* (2013.01); *B32B 7/12* (2013.01); *B32B 27/065* (2013.01);
(Continued)

(58) Field of Classification Search
CPC ...... H10K 77/111; H10K 59/40; H10K 71/00; H10K 50/86; B32B 5/18; B32B 7/12;
(Continued)

(56) References Cited

U.S. PATENT DOCUMENTS

| | | | |
|---|---|---|---|
| 2014/0036170 A1* | 2/2014 | Nashiki | G06F 3/03 349/12 |
| 2014/0049699 A1* | 2/2014 | Huang | G02B 5/3025 349/12 |

(Continued)

FOREIGN PATENT DOCUMENTS

| | | |
|---|---|---|
| CN | 206490064 | 9/2017 |
| CN | 107646100 | 1/2018 |

(Continued)

OTHER PUBLICATIONS

Xiao Zhi-yong et al. (CN206490064 A) Display device of organic light-emitting diodes Sep. 12, 2017 Wuhan Tianma Micro Electronics Co Ltd paragraphs 21-34 figure 2 English.*

(Continued)

*Primary Examiner* — Prabodh M Dharia

(57) ABSTRACT

A display panel and a manufacturing method thereof are provided. The display panel includes a buffer layer and/or at least one adhesive layer. The buffer layer is disposed on a bottom of the display panel, and the adhesive layer is disposed between two of adjacent layers in a layered structure of the display panel. Wherein, the buffer layer and the adhesive layer have materials having Poisson's ratio of less than 0.1.

12 Claims, 3 Drawing Sheets

(51) Int. Cl.
| | |
|---|---|
| *B32B 7/12* | (2006.01) |
| *B32B 27/06* | (2006.01) |
| *B32B 27/28* | (2006.01) |
| *B32B 37/12* | (2006.01) |
| *B32B 38/00* | (2006.01) |
| *G06F 3/041* | (2006.01) |
| *H10K 50/86* | (2023.01) |
| *H10K 59/40* | (2023.01) |
| *H10K 71/00* | (2023.01) |
| *H10K 102/00* | (2023.01) |

(52) U.S. Cl.
CPC ............ *B32B 27/281* (2013.01); *B32B 37/12* (2013.01); *B32B 38/00* (2013.01); *G06F 3/0412* (2013.01); *H10K 50/86* (2023.02); *H10K 59/40* (2023.02); *H10K 71/00* (2023.02); *B32B 2038/0084* (2013.01); *B32B 2264/108* (2013.01); *B32B 2266/0278* (2013.01); *B32B 2307/402* (2013.01); *B32B 2307/42* (2013.01); *B32B 2457/208* (2013.01); *G06F 2203/04102* (2013.01); *G06F 2203/04103* (2013.01); *H10K 2102/311* (2023.02)

(58) Field of Classification Search
CPC ..... B32B 27/065; B32B 27/281; B32B 37/12; B32B 38/00; G06F 3/0412
USPC ........................................................ 345/173
See application file for complete search history.

(56) References Cited

U.S. PATENT DOCUMENTS

| | | | |
|---|---|---|---|
| 2018/0061893 A1* | 3/2018 | Breedlove | G06F 3/041 |
| 2020/0309999 A1* | 10/2020 | Thompson | B32B 5/16 |
| 2021/0375999 A1* | 12/2021 | Xu | H10K 50/844 |

FOREIGN PATENT DOCUMENTS

| | | |
|---|---|---|
| CN | 108230910 | 6/2018 |
| CN | 109411525 | 3/2019 |

OTHER PUBLICATIONS

Jin Lei et al. (CN 109411525 A) Flexible display panel and preparation method thereof Mar. 1, 2019 Yungu Guan Tech Co Ltd paragraphs 35-91 figure 2-7 English.*

CN_109411525_A_I Display device of organic light-emitting diodes Sep. 12, 2017 Wuhan Tianma Micro Electronics Co Ltd paragraphs 35-91 figures 2-7 Chinese.*

CN_206490064_A_IFlexible display panel and preparation method thereof Mar. 1, 2019 Yungu Guan Tech Co Ltd paragraphs 21-34, figure 2 Chinese.*

* cited by examiner

DISPLAY PANEL AND MANUFACTURING METHOD THEREOF

RELATED APPLICATIONS

This application is a National Phase of PCT Patent Application No. PCT/CN2020/114712 having International filing date of Sep. 11, 2020, which claims the benefit of priority of Chinese Patent Application No. 202010490750.7 filed on Jun. 2, 2020. The contents of the above applications are all incorporated by reference as if fully set forth herein in their entirety.

FIELD AND BACKGROUND OF THE INVENTION

The present disclosure relates to the field of display device technologies, and more particularly, to a display panel and a manufacturing method thereof.

Organic light-emitting diode (OLED) display technology has advantages of low power consumption, foldability, light-weightness, and thinness, which is suitable for application scenarios such as full screens, waterfall screens, and foldable screens, and is an important display technology for current and future displays, thereby having a wide application prospect.

In OLED display panels, each display functional layer is attached together by optical adhesive (OCA) glue layers. The OCA glue layers have a higher proportion in a stack and play an important role in maintaining stability, recoverability, and bending life during bending processes of a module structure, which are key structural functional layers to prevent each functional layer from peeling off. However, in bending processes of current module structure, loss of effectiveness of the OCA glue layers (peeling between each display function layer) is one of main hindrances to limit applications of bendable display screens. Meanwhile, due to repeated folding, permanent creases are left on a surface of display screens, which limits a service life of products and user experiences.

Technical problem: an objective of the present disclosure is to provide a display panel and a manufacturing method thereof to solve problems such as peeling off and insufficient recoverability of flexible module stacked structures in current technology.

SUMMARY OF THE INVENTION

To realize the above objective, the present disclosure provides a display panel. The display panel includes a flexible substrate layer, a display layer, a touch control layer, a polarizer, a cover plate, and a buffer layer and/or at least one adhesive layer.

The display layer is disposed on the flexible substrate layer. The touch control layer is disposed on one surface of the display layer away from the flexible substrate layer. The polarizer is disposed on one surface of the touch control layer away from the display layer. The cover plate is disposed on one surface of the polarizer away from the touch control layer. The buffer layer is disposed on one surface of the flexible substrate layer away from the display layer and has a material having Poisson's ratio of less than 0.1; and/or the adhesive layer is disposed between two of adjacent layers in a layered structure of the display panel and has another material having Poisson's ratio of less than 0.1.

Further, the material of the buffer layer includes a polyurethane foam material and white carbon black particles.

Further, the material of the adhesive layer includes at least one of a polyurethane based optical adhesive, an acrylic based optical adhesive, or a rubber based optical adhesive, and side groups of chemical groups of the polyurethane based optical adhesive, the acrylic based optical adhesive, and the rubber based optical adhesive have liquid crystal molecules.

Further, the display panel has a bending direction toward the flexible substrate layer or the cover plate.

The display panel further includes a first protective layer and a second protective layer.

The first protective layer is disposed between the two of the adjacent layers in the layered structure of the display panel, on one side of the flexible substrate layer away from the display layer, or on one side of the cover plate away from the polarizer. The second protective layer is disposed between another two of the adjacent layers in the layered structure of the display panel, on the side of the flexible substrate layer away from the display layer, or on the side of the cover plate away from the polarizer. At least one of the flexible substrate layer, the display layer, the touch control layer, the polarizer, or the cover plate is positioned between the first protective layer and the second protective layer.

Wherein, the first protective layer has yet another material having Poisson's ratio of less than 0.1, and the second protective layer has a material having Poisson's ratio that is a positive number. Areas of the flexible substrate layer, the display layer, the touch control layer, the polarizer, and the cover plate are each less than an area of the first protective layer or the second protective layer.

Further, when the bending direction is toward the flexible substrate layer, the first protective layer is disposed on one side of the display panel adjacent to the flexible substrate layer, and the second protective layer is disposed on one side of the display panel adjacent to the cover plate; and when the bending direction is toward the cover plate, the first protective layer is disposed on the side of the display panel adjacent to the cover plate, and the second protective layer is disposed on the side of the display panel adjacent to the flexible substrate layer.

An embodiment of the present disclosure further provides a manufacturing method of a display panel. The method includes following steps:

providing a flexible substrate layer; forming a display layer, a touch control layer, a polarizer, and a cover plate on the flexible substrate layer in sequence; forming a buffer layer on one surface of the flexible substrate layer away from the display layer; and/or forming an adhesive layer between two of adjacent layers in a layered structure of the display panel.

Wherein, the buffer layer and the adhesive layer have materials having Poisson's ratio of less than 0.1.

Further, the material of the buffer layer includes a polyurethane foam material and white carbon black particles.

Further, the step of forming the buffer layer on the surface of the flexible substrate layer away from the display layer includes following steps:

adding a foaming material to form a foam material by one step foaming process, wherein the foaming material comprises the white carbon black particles; compressing the foam material under a pressure of less than 21 MPa; after fixing the pressure, treating the foam material at a temperature of greater than 25° C. and less than 140° C. for 1 to 2 hours; and after treating the foam material at the temperature, taking out and cooling the foam material to room temperature to form the polyurethane foam material.

Further, the material of the adhesive layer includes at least one of a polyurethane based optical adhesive, an acrylic based optical adhesive, or a rubber based optical adhesive, and side groups of chemical groups of the polyurethane based optical adhesive, the acrylic based optical adhesive, and the rubber based optical adhesive have liquid crystal molecules.

Further, the step of forming the adhesive layer between the two of the adjacent layers in the layered structure of the display panel includes following steps:

adding small molecule liquid crystals into a first compound, and obtaining an alcohol esterification product after they are fully reacted; mixing the alcohol esterification product with a second compound to obtain a polymerizable monomer mixture; adding an azo initiator into the polymerizable monomer mixture to induce a free radical homogeneous polymerization, and obtaining a modified first compound; and treating the modified first compound by polymer uniaxial stretching orientation process to obtain an optical adhesive having the liquid crystal molecules in its side groups.

Wherein, the first compound is one of polyurethane, acrylate, or rubber, and the second compound is another alcohol esterification product.

Beneficial effect: advantages of the present disclosure are that the display panel and the manufacturing method thereof of the present disclosure can extend a service life of the display panel using a negative Poisson's ratio material having Poisson's ratio of less than 0.1, and can improve impact resistances of film layers by characteristics of the negative Poisson's ratio material, thereby improving flexibility of the film layers and stability of the display panel.

BRIEF DESCRIPTION OF THE SEVERAL VIEWS OF THE DRAWINGS

The accompanying figures to be used in the description of embodiments of the present disclosure will be described in brief to more clearly illustrate the technical solutions of the embodiments. The accompanying figures described below are only part of the embodiments of the present disclosure, from which those skilled in the art can derive further figures without making any inventive efforts.

Figure 1:
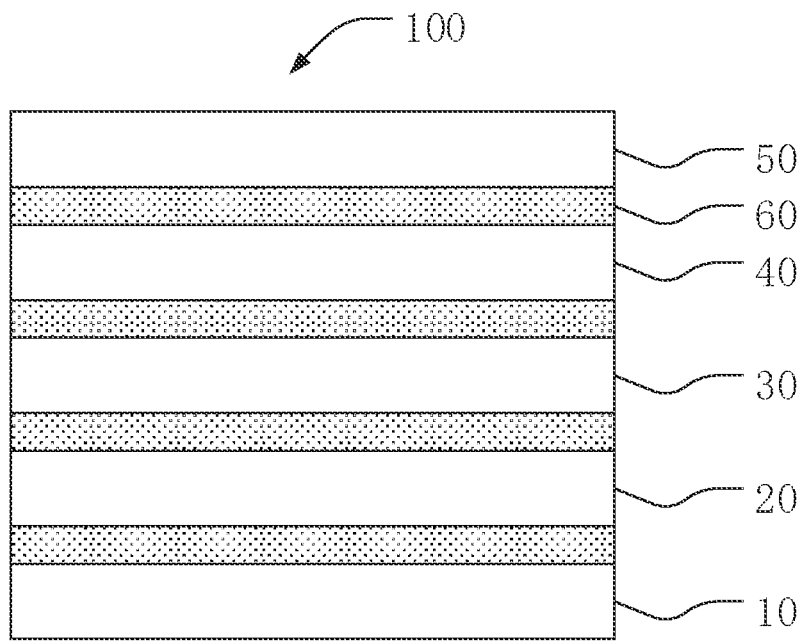
FIG. 1 is a schematic diagram of a layered structure of a display panel according to embodiment 1 of the present disclosure.

Elements in the drawings are designated by reference numerals listed below.

100. display panel; 101. bending direction;
10. flexible substrate layer; 20. display layer;
30. touch control layer; 40. polarizer;
50. cover plate; 60. adhesive layer;
70. buffer layer; 80. first protective layer;
90. second protective layer.

DESCRIPTION OF SPECIFIC EMBODIMENTS OF THE INVENTION

Hereinafter, the preferred embodiments of the present disclosure will be introduced with reference to the drawings of the specification to prove that the present disclosure can be implemented. The embodiments of the present disclosure can fully introduce the present disclosure to those skilled in the art, so that the technical content is clearer and easier to understand. The disclosure herein provides many different embodiments or examples for realizing different structures of the present disclosure. They are only examples and are not intended to limit the present disclosure.

In the accompanying drawings, wherein the identical or similar reference numerals constantly denote the identical or similar elements or elements having the identical or similar functions. In the drawings, structurally identical components are denoted by the same reference numerals, and structural or functionally similar components are denoted by like reference numerals. Moreover, a size and a thickness of each component shown in the drawings are arbitrarily shown, and the present disclosure does not limit the size and thickness of each component. In order to make the drawings clearer, thicknesses of some components in the drawings are appropriately exaggerated.

Besides, the specific embodiments described with reference to the attached drawings are all exemplary and are intended to illustrate and interpret the present disclosure. In the description of the present disclosure, it should be understood that terms such as "upper", "lower", "front", "rear", "left", "right", "inside", "outside", "side", as well as derivative thereof should be construed to refer to the orientation as described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance.

When a component is described as "on" another component, the component can be placed directly on the other component; an intermediate component can also exist, the component is placed on the intermediate component, and the intermediate component is placed on another component. When a component is described as "installed to" or "connected to" another component, it can be understood as directly "installed to" or "connected to", or a component is "mounted to" or "connected to" another component through an intermediate component.

Embodiment 1

This embodiment of the present disclosure provides a display panel 100, as shown in FIG. 1. The display panel 100 includes a flexible substrate layer 10, a display layer 20, a touch control layer 30, a polarizer 40, a cover plate 50, and four adhesive layers 60.

The flexible substrate layer 10 is a polyimide (PI) layer, which ensures the display panel 100 to have a flexible feature that can be bent.

The display layer 20 is disposed on the flexible substrate layer 10 and formed by arranging a plurality of organic light-emitting diode (OLED) display devices in an array, which has a characteristic of self-illumination. The display panel 100 displays color pictures by the display layer 20.

The touch control layer 30 is disposed on one surface of the display layer 20 away from the flexible substrate layer 10. The touch control layer 30 has a plurality of wirings and pressure sensors, and is configured to sense pressure changes received by the display panel 100 and generate touch control signals, thereby realizing touch control.

The polarizer 40 is disposed on one surface of the touch control layer 30 away from the display layer 20. The polarizer 40 is configured to polarize light emitted from an organic electroluminescent layer, thereby generating contrast between brightness and darkness and displaying pictures.

The cover plate 50 is a glass substrate and is disposed on one surface of the polarizer 40 away from the touch control layer 30. The cover plate 50 is configured to protect entire structure of the display panel 100, improve surface flatness and impact resistances of the display panel 100 while realizing flexibility and bendability, and improve a texture of display screens.

In this embodiment of the present disclosure, there are four adhesive layers 60, and they are respectively disposed between the flexible substrate layer 10 and the display layer 20, between the display layer 20 and the touch control layer 30, between the touch control layer 30 and the polarizer 40, and between the polarizer 40 and the cover plate 50. The adhesive layers 60 are configured to improve adhesion between film layers.

Wherein, the adhesive layers 60 use a negative Poisson's ratio optical adhesive having Poisson's ratio of less than 0.1. The optical adhesive may be one of a polyurethane based optical adhesive, an acrylic based optical adhesive, or a rubber based optical adhesive, and side groups of chemical groups of the polyurethane based optical adhesive, the acrylic based optical adhesive, and the rubber based optical adhesive have liquid crystal molecules. When the display panel 100 is bent, a squeezed bent part of the optical adhesive having Poisson's ratio of less than 0.1 will have a reverse flow, and stresses of this reverse flow can resist flowing phenomena of glues during bending, thereby preventing plastic deformation of the adhesive layers 60 caused by repeated bending, further improving the adhesion between the film layers, and preventing delamination and peeling off.

An embodiment of the present disclosure further provides a manufacturing method of the above display panel 100. The method includes following steps:

step S10: providing the flexible substrate layer 10. The flexible substrate layer 10 is the polyimide layer, which is manufactured by deposition and coating.

Step S20: forming the display layer 20, the touch control layer 30, the polarizer 40, and the cover plate 50 on the flexible substrate layer 10 in sequence.

The display layer 20, the touch control layer 30, the polarizer 40, and the cover plate 50 are manufactured in advance. One layer of an adhesive layer 60 material is coated on the flexible substrate layer 10, the display layer 20 is attached onto the adhesive layer 60, and the adhesive layer 60 material is cured by UV light irradiation to form one of the adhesive layers 60. By analogy, the touch control layer 30, the polarizer 40, and the cover plate 50 are sequentially attached onto the display layer 20 by the adhesive layers 60 to form the display panel 100.

Wherein, the adhesive layers 60 use the acrylic based optical adhesive having the liquid crystal molecules in its side groups, and a manufacturing method of the acrylic based optical adhesive is as follows:

adding small molecule liquid crystals into a first compound, and obtaining an alcohol esterification compound after they are fully reacted. Mixing the alcohol esterification compound with a second compound to obtain a polymerizable monomer mixture. The second compound is an alcohol esterification product, such as polymethyl acrylate. After that, adding an azo initiator into the polymerizable monomer mixture to induce a free radical homogeneous polymerization by the azo initiator, and obtaining a modified first compound with side groups having the liquid crystal molecules.

After that, orientating the modified first compound by a polymer uniaxial stretching process, which has a negative Poisson's ratio stretching direction, to improve molecular orientation. Finally, the acrylic based optical adhesive having the liquid crystal molecules in its side groups is obtained.

When this acrylic based optical adhesive having the liquid crystal molecules in its side groups is subjected to an external force, a flexible main chain tends to stretch, while rigid side groups are rigidly connected to the main chain and expand as the main chain stretches. Therefore, free volume of a molecular chain increases, thereby obtaining a certain negative Poisson's ratio effect, which further improves characteristics of the adhesive layers 60, increases adhesion thereof, and reduces fluidity thereof.

The first compound used in this embodiment is acrylate, materials such as polyurethane or rubber may also be used in other embodiments of the present disclosure to manufacture the polyurethane based optical adhesive or rubber based optical adhesive. Manufacturing methods thereof are similar to this embodiment, so it is not repeated herein. Based on the embodiments in the present disclosure, all other embodiments obtained by those skilled in the art without creative efforts are within the scope of the present disclosure.

The embodiment of the present disclosure uses the material having Poisson's ratio of less than 0.1 to bond the film layers. This material will have the reverse flow when subjected to bending and squeezing, and the stresses of this reverse flow can resist the flowing phenomena of glues during bending, thereby preventing the adhesive layers 60 from having deformation and cracks due to the deformation, further improving the adhesion between the film layers, preventing delamination and peeling off, and improving stability of the display panel 100.

Embodiment 2

Figure 2:
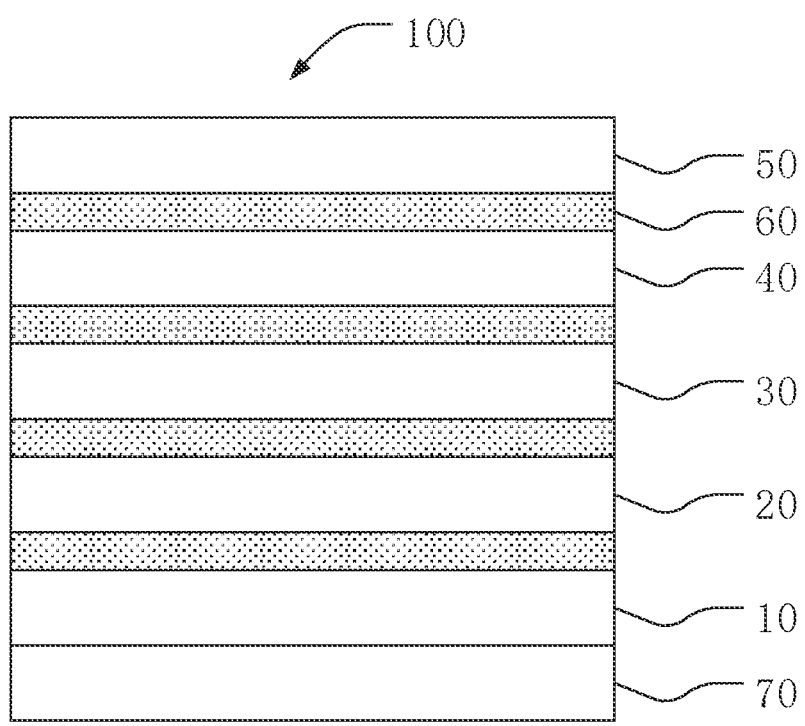
FIG. 2 is a schematic diagram of a layered structure of a display panel according to embodiment 2 of the present disclosure.

This embodiment of the present disclosure provides a display panel 100, as shown in FIG. 2. The display panel 100 includes a flexible substrate layer 10, a display layer 20, a touch control layer 30, a polarizer 40, a cover plate 50, and a buffer layer 70.

The flexible substrate layer 10 is a polyimide (PI) layer, which ensures the display panel 100 to have a flexible feature that can be bent.

The display layer 20 is disposed on the flexible substrate layer 10 and formed by arranging a plurality of organic light-emitting diode (OLED) display devices in an array, which has a characteristic of self-illumination. The display panel 100 displays color pictures by the display layer 20.

The touch control layer 30 is disposed on one surface of the display layer 20 away from the flexible substrate layer 10. The touch control layer 30 has a plurality of wirings and pressure sensors, and is configured to sense pressure changes received by the display panel 100 and generate touch control signals, thereby realizing touch control.

The polarizer 40 is disposed on one surface of the touch control layer 30 away from the display layer 20. The polarizer 40 is configured to polarize light emitted from an organic electroluminescent layer, thereby generating contrast between brightness and darkness and displaying pictures.

The cover plate 50 is a glass substrate and is disposed on one surface of the polarizer 40 away from the touch control layer 30. The cover plate 50 is configured to protect entire structure of the display panel 100, improve surface flatness and impact resistances of the display panel 100 while realizing flexibility and bendability, and improve a texture of display screens.

Adhesive layers 60 are each disposed between the flexible substrate layer 10 and the display layer 20, between the display layer 20 and the touch control layer 30, between the touch control layer 30 and the polarizer 40, and between the polarizer 40 and the cover plate 50. The adhesive layers 60 are configured to improve adhesion between film layers. The adhesive layers 60 may be an ordinary optical adhesive or may also use a negative Poisson's ratio optical adhesive having Poisson's ratio of less than 0.1 same as the adhesive layers 60 in embodiment 1.

The buffer layer 70 is disposed on one surface of the flexible substrate layer 10 away from the display layer 20, which is configured to buffer and protect a structure of the display panel 100. The buffer layer 70 has another negative Poisson's ratio material, such as a urethane foam material having Poisson's ratio of less than 0.1. The urethane foam material includes white carbon black particles. The urethane foam material having Poisson's ratio of less than 0.1 has excellent flexibility, and the flexibility thereof is not easy to fatigue, which is helpful for reducing bends and folds generated after bending, thereby further flattening the display panel 100. When the display panel 100 is subjected to an impact, the buffer layer 70 can correspondingly generate a stress opposite to an impact direction to counteract a part of the impact due to Poisson's ratio, thereby improving impact resistances and bending resistances of the display panel 100. In addition, a mass energy absorption coefficient of the buffer layer 70 in this embodiment is higher, so it has a higher energy absorption efficiency, which has stronger damping characteristics.

An embodiment of the present disclosure further provides a manufacturing method of the above display panel 100. The method includes following steps:

step S10: providing the flexible substrate layer 10. The flexible substrate layer 10 is the polyimide layer, which is manufactured by deposition and coating.

Step S20: forming the buffer layer 70 on the surface of the flexible substrate layer 10 away from the display layer 20.

Mixing a black material (isocyanate), a white material (polyether polyol or polyester polyol), the white carbon black particles, water, catalysts, and additives such as a foaming agent, and forming a foam material by one step foaming process. Compressing the foam material under a lower pressure of less than 21 MPa. Then fixing the pressure, increasing a temperature of the foam material at a temperature of greater than 25° C. and less than 140° C. for 1 to 2 hours. After treating the foam material at the temperature, taking out and cooling the foam material to room temperature to form a polyurethane foam material.

The polyurethane foam material is coated on the surface of the flexible substrate layer 10 and cured to form the buffer layer 70.

Step S30: forming the display layer 20, the touch control layer 30, the polarizer 40, and the cover plate 50 on the flexible substrate layer 10 in sequence.

The display layer 20, the touch control layer 30, the polarizer 40, and the cover plate 50 are manufactured in advance. The flexible substrate layer 10 is coated with one layer of adhesive material, the display layer 20 is attached to the adhesive material, and the adhesive material is cured by UV light irradiation to form an adhesive. By analogy, the touch control layer 30, the polarizer 40, and the cover plate 50 are sequentially attached onto the display layer 20 by the adhesive to form the display panel 100.

The embodiment of the present disclosure uses the material having Poisson's ratio of less than 0.1 to manufacture the buffer layer 70, which makes the buffer layer 70 have excellent flexibility and the flexibility thereof uneasy to fatigue, which is helpful for reducing bends and folds generated after bending, thereby further flattening the display panel 100. When the display panel 100 is subjected to an impact, the buffer layer 70 can correspondingly generate a stress opposite to an impact direction to counteract a part of the impact due to Poisson's ratio, thereby improving impact resistances and bending resistances of the display panel 100. In addition, a mass energy absorption coefficient of the buffer layer 70 in this embodiment is higher, so it has a higher energy absorption efficiency, which has stronger damping characteristics.

Embodiment 3

Figure 3:
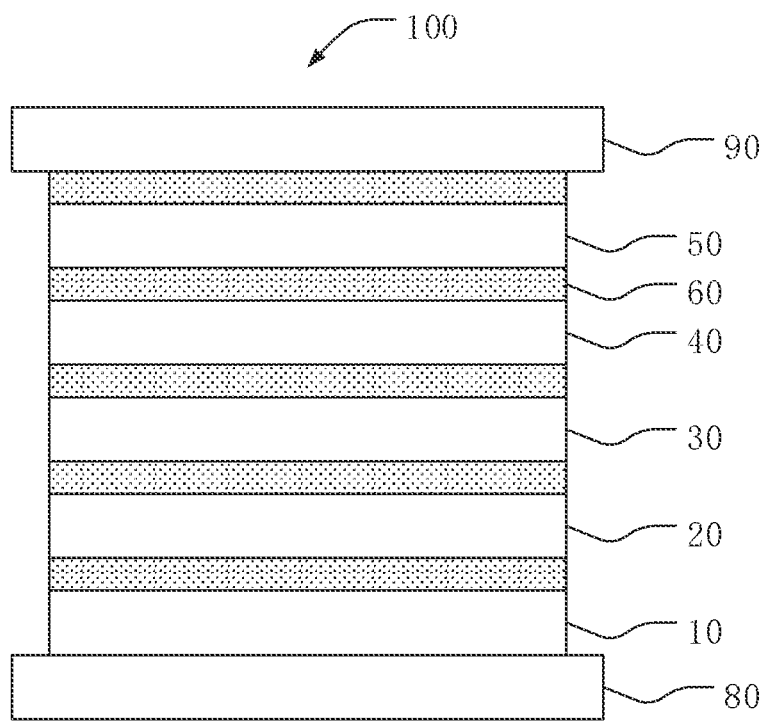
FIG. 3 is a schematic diagram of a layered structure of a display panel according to embodiment 3 of the present disclosure.

This embodiment of the present disclosure provides a display panel 100, as shown in FIG. 3. The display panel 100 includes a flexible substrate layer 10, a display layer 20, a touch control layer 30, a polarizer 40, and a cover plate 50. The display panel 100 has a bending direction 101 toward the flexible substrate layer 10.

The flexible substrate layer 10 is a polyimide (PI) layer, which ensures the display panel 100 to have a flexible feature that can be bent.

The display layer 20 is disposed on the flexible substrate layer 10 and formed by arranging a plurality of organic light-emitting diode (OLED) display devices in an array, which has a characteristic of self-illumination. The display panel 100 displays color pictures by the display layer 20.

The touch control layer 30 is disposed on one surface of the display layer 20 away from the flexible substrate layer 10. The touch control layer 30 has a plurality of wirings and pressure sensors, and is configured to sense pressure changes received by the display panel 100 and generate touch control signals, thereby realizing touch control.

The polarizer 40 is disposed on one surface of the touch control layer 30 away from the display layer 20. The polarizer 40 is configured to polarize light emitted from an organic electroluminescent layer, thereby generating contrast between brightness and darkness and displaying pictures.

The cover plate 50 is a glass substrate and is disposed on one surface of the polarizer 40 away from the touch control layer 30. The cover plate 50 is configured to protect entire structure of the display panel 100, improve surface flatness and impact resistances of the display panel 100 while realizing flexibility and bendability, and improve a texture of display screens.

Adhesive layers 60 are each disposed between the flexible substrate layer 10 and the display layer 20, between the display layer 20 and the touch control layer 30, between the touch control layer 30 and the polarizer 40, and between the polarizer 40 and the cover plate 50. The adhesive layers 60 are configured to improve adhesion between film layers.

The display panel 100 further includes a first protective layer 80 and a second protective layer 90.

The first protective layer 80 is disposed on one surface of the flexible substrate layer 10 away from the display layer 20. An area of the first protective layer 80 is greater than an area of any one of the flexible substrate layer 10, the display layer 20, the touch control layer 30, the polarizer 40, and the cover plate 50, and orthographic projections of the above film layers on the first protective layer 80 are in a central position of the first protective layer 80. The first protective layer 80 has a negative Poisson's ratio material having Poisson's ratio of less than 0.1, such as the polyurethane foam material used in embodiment 2 or a negative Poisson's ratio rubber material.

The second protective layer 90 is disposed on one surface of the cover plate 50 away from the polarizer 40, and one of the adhesive layers 60 is disposed between the second protective layer 90 and the cover plate 50 to improve adhesion between the second protective layer 90 and the cover plate 50. An area of the second protective layer 90 is also greater than the area of any one of the flexible substrate layer 10, the display layer 20, the touch control layer 30, the polarizer 40, and the cover plate 50, and orthographic projections of the above film layers on the second protective layer 90 are also in a central position of the second protective layer 90. The second protective layer 90 has a positive Poisson's ratio material having Poisson's ratio that is a positive number. Further, A material having Poisson's ratio of greater than 0.1 may be selected.

Figure 5:
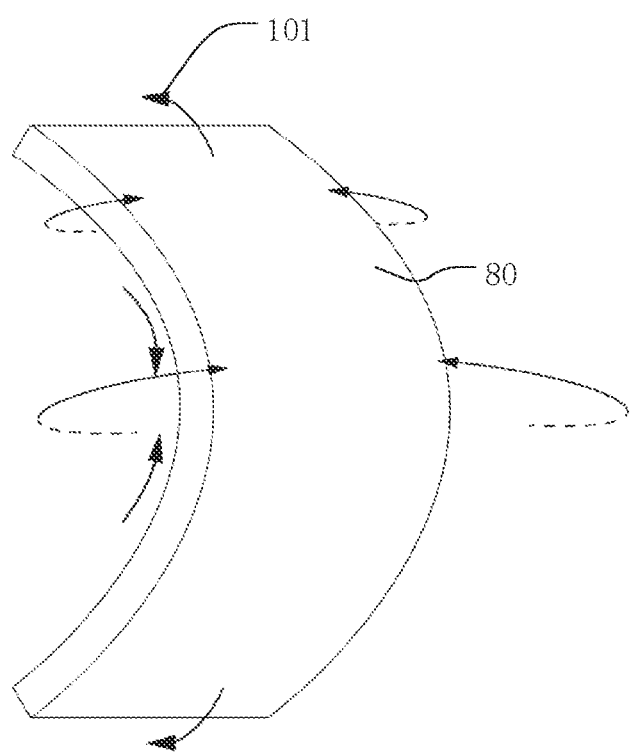
FIG. 5 is a schematic bending diagram of a first protective layer according to embodiments 3 or 4 of the present disclosure.
Figure 6:
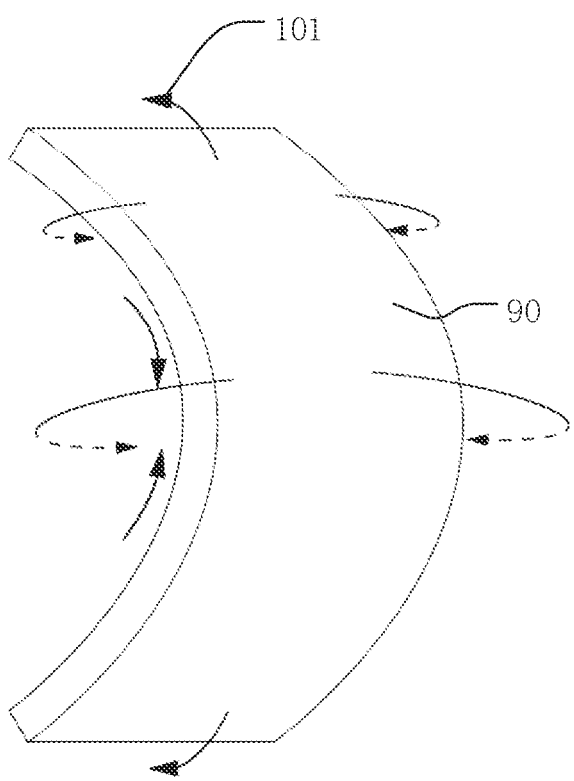
FIG. 6 is a schematic bending diagram of a second protective layer according to embodiments 3 or 4 of the present disclosure.

As shown in FIG. 5, due to material characteristics of the negative Poisson's ratio material used, the first protective layer 80 will generate a stress opposite to the bending direction 101 when subjected to bending and compressing. As shown in FIG. 6, due to material characteristics of the positive Poisson's ratio material used, the second protective layer 90 will generate a stress having a same direction as the bending direction 101 when subjected to bending and compressing. Therefore, by cooperation of the first protective layer 80 and the second protective layer 90, when the display panel 100 is bent, edge parts of the first protective layer 80 and the second protective layer 90 beyond other film layers of the display panel 100 will generate an internal deduction effect to protect film layers between the first protective layer 80 and the second protective layer 90, thereby preventing edges of the display panel from peeling off.

In this embodiment of the present disclosure, the first protective layer 80 and the second protective layer 90 are respectively positioned on a top surface and a bottom surface of the display panel 100. In other embodiments, each the first protective layer 80 and the second protective layer 90 may also be positioned between two of adjacent film layers in a layered structure of the display panel 100. Numbers of film layers between the first protective layer 80 and the second protective layer 90 are not limited, which may be a film layer structure having one layer or multiple layers. For example, the first protective layer 80 is disposed between the display layer 20 and the flexible substrate layer 10, the second protective layer 90 is disposed between the touch control layer 30 and the display layer 20, and there is only the display layer 20 between the first protective layer 80 and the second protective layer 90. When the display panel is bent, the internal deduction effect between the first protective layer 80 and the second protective layer 90 will protect the display layer 20. The principle and other layered structures are same as those in embodiment 3 of the present disclosure, which are not repeated herein. Based on the embodiments in the present disclosure, all other embodiments obtained by those skilled in the art without creative efforts are within the scope of the present disclosure.

Embodiment 4

Figure 4:
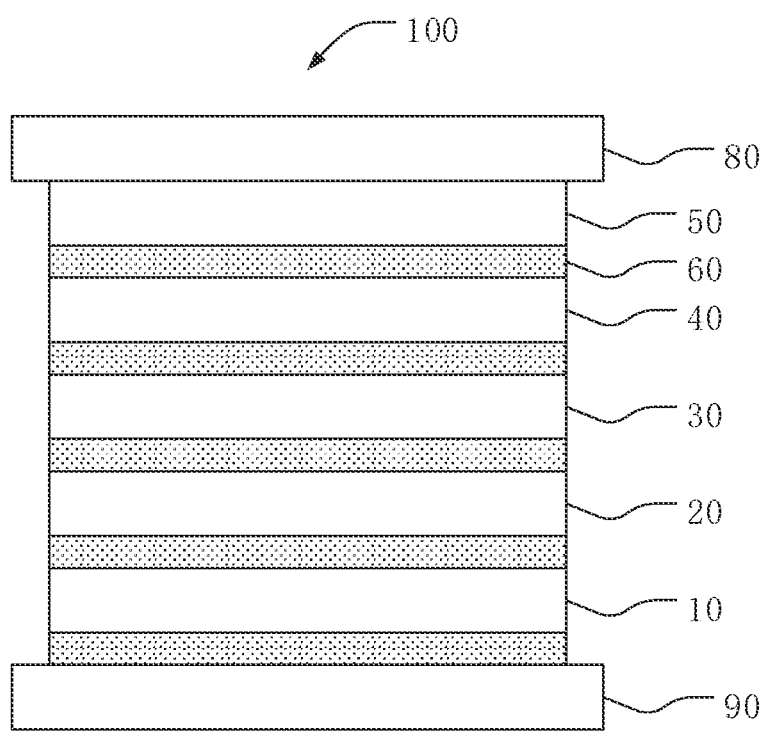
FIG. 4 is a schematic diagram of a layered structure of a display panel according to embodiment 4 of the present disclosure.

This embodiment of the present disclosure provides a display panel 100, as shown in FIG. 4. The display panel 100 includes a flexible substrate layer 10, a display layer 20, a touch control layer 30, a polarizer 40, and a cover plate 50. The display panel 100 has a bending direction 101 toward the cover plate 50.

The flexible substrate layer 10 is a polyimide (PI) layer, which ensures the display panel 100 to have a flexible feature that can be bent.

The display layer 20 is disposed on the flexible substrate layer 10 and formed by arranging a plurality of organic light-emitting diode (OLED) display devices in an array, which has a characteristic of self-illumination. The display panel 100 displays color pictures by the display layer 20.

The touch control layer 30 is disposed on one surface of the display layer 20 away from the flexible substrate layer 10. The touch control layer 30 has a plurality of wirings and pressure sensors, and is configured to sense pressure changes received by the display panel 100 and generate touch control signals, thereby realizing touch control.

The polarizer 40 is disposed on one surface of the touch control layer 30 away from the display layer 20. The polarizer 40 is configured to polarize light emitted from an organic electroluminescent layer, thereby generating contrast between brightness and darkness and displaying pictures.

The cover plate 50 is a glass substrate and is disposed on one surface of the polarizer 40 away from the touch control layer 30. The cover plate 50 is configured to protect entire structure of the display panel 100, improve surface flatness and impact resistances of the display panel 100 while realizing flexibility and bendability, and improve a texture of display screens.

Adhesive layers 60 are each disposed between the flexible substrate layer 10 and the display layer 20, between the display layer 20 and the touch control layer 30, between the touch control layer 30 and the polarizer 40, and between the polarizer 40 and the cover plate 50. The adhesive layers 60 are configured to improve adhesion between film layers.

The display panel 100 further includes a first protective layer 80 and a second protective layer 90.

The first protective layer 80 is disposed on one surface of the cover plate 50 away from the polarizer 40. An area of the first protective layer 80 is greater than an area of any one of the flexible substrate layer 10, the display layer 20, the touch control layer 30, the polarizer 40, and the cover plate 50, and orthographic projections of the above film layers on the first protective layer 80 are in a central position of the first protective layer 80. The first protective layer 80 has a negative Poisson's ratio material having Poisson's ratio of less than 0.1, such as the polyurethane foam material used in embodiment 2 or a negative Poisson's ratio rubber material.

The second protective layer 90 is disposed on one surface of the flexible substrate layer 10 away from the display layer 20, and one of the adhesive layers 60 is disposed between the second protective layer 90 and the flexible substrate layer 10 to improve adhesion between the second protective layer 90 and the flexible substrate layer 10. An area of the second protective layer 90 is also greater than the area of any one of the flexible substrate layer 10, the display layer 20, the touch control layer 30, the polarizer 40, and the cover plate 50, and orthographic projections of the above film layers on the second protective layer 90 are also in a central position of the second protective layer 90. The second protective layer 90 has a positive Poisson's ratio material having Poisson's ratio that is a positive number. Further, A material having Poisson's ratio of greater than 0.1 may be selected.

As shown in FIG. 5, due to material characteristics of the negative Poisson's ratio material used, the first protective layer 80 will generate a stress opposite to the bending direction 101 when subjected to bending and compressing. As shown in FIG. 6, due to material characteristics of the positive Poisson's ratio material used, the second protective layer 90 will generate a stress having a same direction as the bending direction 101 when subjected to bending and compressing. Therefore, by cooperation of the first protective layer 80 and the second protective layer 90, when the display panel 100 is bent, edge parts of the first protective layer 80 and the second protective layer 90 beyond other film layers of the display panel 100 will generate an internal deduction effect to protect film layers between the first protective layer 80 and the second protective layer 90, thereby preventing edges of the display panel from peeling off.

In this embodiment of the present disclosure, the first protective layer 80 and the second protective layer 90 are respectively positioned on a top surface and a bottom surface of the display panel 100. In other embodiments, each the first protective layer 80 and the second protective layer 90 may also be positioned between two of adjacent film layers in a layered structure of the display panel 100. Numbers of film layers between the first protective layer 80 and the second protective layer 90 are not limited, which may be a film layer structure having one layer or multiple layers. For example, the first protective layer 80 is disposed between the cover plate 50 and the polarizer 40, the second protective layer 90 is disposed between the touch control layer 30 and the display layer 20, and there is a film layer structure having two film layers: the polarizer 40 and the touch control layer 30 between the first protective layer 80 and the second protective layer 90. When the display panel is bent, the internal deduction effect between the first protective layer 80 and the second protective layer 90 will protect the polarizer 40 and the touch control layer 30. The principle and other layered structures are same as those in embodiment 4 of the present disclosure, which are not repeated herein. Based on the embodiments in the present disclosure, all other embodiments obtained by those skilled in the art without creative efforts are within the scope of the present disclosure.

Although the present disclosure is described herein with reference to specific embodiments, it should be understood that these embodiments are merely examples of the principles and applications of the present disclosure. It should therefore be understood that many modifications can be made to the exemplary embodiments, and other arrangements can be devised as long as they do not deviate from the spirit and scope of the present disclosure as defined by the appended claims. It should be understood that different dependent claims and features described herein can be combined in ways different from those described in the original claims. It can also be understood that features described in combination with a single embodiment can be used in other embodiments.

What is claimed is:

1. A display panel, comprising:
   a flexible substrate layer;
   a display layer disposed on the flexible substrate layer;
   a touch control layer disposed on one surface of the display layer away from the flexible substrate layer;
   a polarizer disposed on one surface of the touch control layer away from the display layer;
   a cover plate disposed on one surface of the polarizer away from the touch control layer;
   a buffer layer disposed on one surface of the flexible substrate layer away from the display layer, wherein the buffer layer comprises a material having Poisson's ratio of less than 0.1; and
   at least one adhesive layer disposed between two adjacent layers in a layered structure of the display panel, wherein the adhesive layer comprises a material having Poisson's ratio of less than 0.1;
   wherein the material of the adhesive layer comprises at least one of a polyurethane based optical adhesive, an acrylic based optical adhesive, and a rubber based optical adhesive, and side chains of the polyurethane based optical adhesive, side chains of the acrylic based optical adhesive, and side chains of the rubber based optical adhesive are all modified by liquid crystal molecules.

2. The display panel according to claim 1, wherein the material of the buffer layer comprises a polyurethane foam material containing white carbon black particles.

3. The display panel according to claim 1, having a bending direction toward the flexible substrate layer or the cover plate and further comprising:
   a first protective layer disposed between the two adjacent layers in the layered structure of the display panel, on one side of the flexible substrate layer away from the display layer, or on one side of the cover plate away from the polarizer; and
   a second protective layer disposed between another two adjacent layers in the layered structure of the display panel, on the side of the flexible substrate layer away from the display layer, or on the side of the cover plate away from the polarizer;
   wherein at least one of the flexible substrate layer, the display layer, the touch control layer, the polarizer, and the cover plate is disposed between the first protective layer and the second protective layer;
   the first protective layer comprises a material having Poisson's ratio of less than 0.1, and the second protective layer comprises a material having Poisson's ratio that is a positive number; and
   an area of the flexible substrate layer, an area of the display layer, an area of the touch control layer, an area of the polarizer, and an area of the cover plate are less than an area of the first protective layer or an area of the second protective layer in a horizontal direction of the display panel.

4. The display panel according to claim 3, wherein when the bending direction is toward the flexible substrate layer, the first protective layer is disposed on one side of the display panel adjacent to the flexible substrate layer, and the second protective layer is disposed on one side of the display panel adjacent to the cover plate; and
   when the bending direction is toward the cover plate, the first protective layer is disposed on the side of the display panel adjacent to the cover plate, and the second protective layer is disposed on the side of the display panel adjacent to the flexible substrate layer.

5. The display panel according to claim 1, wherein the at least one adhesive layer are four adhesive layers, and the four adhesive layers are respectively bonded between the flexible substrate layer and the display layer, between the display layer and the touch control layer, between the touch control layer and the polarizer, and between the polarizer and the cover plate.

6. The display panel according to claim 1, having a bending direction toward the flexible substrate layer and further comprising a first protective layer and a second protective layer; the first protective layer is disposed on a surface of the flexible substrate layer away from the display layer, and the second protective layer is disposed on a surface of the cover plate away from the display layer;
the first protective layer comprises a material having Poisson's ratio of less than 0.1, and the second protective layer comprises a material having Poisson's ratio of greater than 0.1.

7. The display panel according to claim 6, wherein an orthographic projection of the flexible substrate layer, an orthographic projection of the display layer, an orthographic projection of the touch control layer, an orthographic projection of the polarizer, and an orthographic projection of the cover plate on the first protective layer are all located at a central position of the first protective layer; and
an orthographic projection of the flexible substrate layer, an orthographic projection of the display layer, an orthographic projection of the touch control layer, an orthographic projection of the polarizer, and an orthographic projection of the cover plate on the second protective layer are all located at a central position of the second protective layer.

8. The display panel according to claim 1, having a bending direction toward the cover plate and further comprising a first protective layer and a second protective layer; the first protective layer is disposed on a surface of the cover plate away from the display layer, and the second protective layer is disposed on a surface of the flexible substrate layer away from the display layer;
the first protective layer comprises a material having Poisson's ratio of less than 0.1, and the second protective layer comprises a material having Poisson's ratio of greater than 0.1.

9. The display panel according to claim 8, wherein an orthographic projection of the flexible substrate layer, an orthographic projection of the display layer, an orthographic projection of the touch control layer, an orthographic projection of the polarizer, and an orthographic projection of the cover plate on the first protective layer are all located at a central position of the first protective layer; and
an orthographic projection of the flexible substrate layer, an orthographic projection of the display layer, an orthographic projection of the touch control layer, an orthographic projection of the polarizer, and an orthographic projection of the cover plate on the second protective layer are all located at a central position of the second protective layer.

10. A manufacturing method of a display panel, comprising following steps:
providing a flexible substrate layer;
forming a display layer, a touch control layer, a polarizer, and a cover plate on the flexible substrate layer in sequence;
forming a buffer layer on one surface of the flexible substrate layer away from the display layer; and
forming an adhesive layer between two adjacent layers in a layered structure of the display panel;
wherein the buffer layer and the adhesive layer have materials having Poisson's ratio of less than 0.1;
wherein the step of forming the adhesive layer between the two adjacent layers in the layered structure of the display panel comprises following steps:
adding liquid crystal molecules into a first compound to obtain an alcohol ester compound, wherein the first compound is one of polyurethane, acrylate, or rubber;
mixing the alcohol ester compound with a second compound to obtain a polymerizable monomer mixture, and adding an azo initiator into the polymerizable monomer mixture to induce a free radical homogeneous polymerization, to obtain a modified first compound; wherein the second compound is ester; and
treating the modified first compound by polymer uniaxial stretching orientation process to obtain a polyurethane based optical adhesive having side chains modified by the liquid crystal molecules, an acrylic based optical adhesive having side chains modified by the liquid crystal molecules, or a rubber based optical adhesive having side chains modified by the liquid crystal molecules.

11. The manufacturing method of the display panel according to claim 10, wherein the material of the buffer layer comprises a polyurethane foam material containing white carbon black particles.

12. The manufacturing method of the display panel according to claim 11, wherein the step of forming the buffer layer on the surface of the flexible substrate layer away from the display layer comprises following steps:
adding a foaming material to form a foam material by one step foaming process, wherein the foaming material comprises the white carbon black particles;
compressing the foam material under a pressure of less than 21 MPa;
after fixing the pressure, treating the foam material at a temperature of greater than 25° C. and less than 140° C. for 1 to 2 hours; and
after treating the foam material at the temperature, taking out and cooling the foam material to room temperature to form the polyurethane foam material.

* * * * *